United States Patent
Zievers

(10) Patent No.: US 8,868,894 B2
(45) Date of Patent: Oct. 21, 2014

(54) COMPUTING SYSTEM WITH HARDWARE SCHEDULED RECONFIGURATION MECHANISM AND METHOD OF OPERATION THEREOF

(75) Inventor: Peter J Zievers, Naperville, IL (US)

(73) Assignee: Xcelemor, Inc., Livermore, CA (US)

( * ) Notice: Subject to any disclaimer, the term of this patent is extended or adjusted under 35 U.S.C. 154(b) by 249 days.

(21) Appl. No.: 13/464,836

(22) Filed: May 4, 2012

(65) Prior Publication Data
US 2012/0284492 A1    Nov. 8, 2012

Related U.S. Application Data

(60) Provisional application No. 61/483,523, filed on May 6, 2011.

(51) Int. Cl.
| | | |
|---|---|---|
| *G06F 9/00* | (2006.01) | |
| *G06F 1/24* | (2006.01) | |
| *G06F 15/00* | (2006.01) | |
| *G06F 15/173* | (2006.01) | |
| *G06F 15/78* | (2006.01) | |
| *G06F 9/24* | (2006.01) | |
| *G06F 15/177* | (2006.01) | |
| *G06F 17/50* | (2006.01) | |

(52) U.S. Cl.
CPC .............. *G06F 17/5027* (2013.01); *G06F 1/24* (2013.01); *G06F 9/24* (2013.01); *G06F 15/177* (2013.01); *G06F 17/5054* (2013.01); *G06F 15/173* (2013.01); *G06F 15/781* (2013.01)
USPC .................................. 713/1; 713/100; 712/15

(58) Field of Classification Search
CPC ...................................................... G06F 9/4401
USPC .............................................................. 713/1
See application file for complete search history.

(56) References Cited

U.S. PATENT DOCUMENTS

| | | | | |
|---|---|---|---|---|
| 6,539,438 | B1* | 3/2003 | Ledzius et al. | 710/8 |
| 6,789,214 | B1* | 9/2004 | De Bonis-Hamelin et al. | 714/15 |
| 7,669,035 | B2* | 2/2010 | Young et al. | 712/15 |
| 8,645,955 | B2* | 2/2014 | Yim et al. | 718/100 |
| 2004/0049672 | A1 | 3/2004 | Nollet et al. | |
| 2006/0003757 | A1* | 1/2006 | Subramanian et al. | 455/418 |
| 2006/0034310 | A1 | 2/2006 | Connor | |
| 2006/0206850 | A1* | 9/2006 | McCubbrey | 716/17 |
| 2008/0086575 | A1 | 4/2008 | Foong et al. | |
| 2009/0276527 | A1 | 11/2009 | McClain et al. | |

OTHER PUBLICATIONS

Compton et al., "An Introduction to Reconfigurable Computing" .. p. 9 Publisher: Northwestern University, Published in: Evanston, US.
Vancourt et al., "Sizing of Processing Arrays for FPGA-Based Computation", , p. 6 Publisher: Boston University, Department of Electrical and Computer Engineering, Published in: Boston, US.
International Search Report for PCT Application No. PCT/US2012/36666 dated Jul. 20, 2012.

* cited by examiner

*Primary Examiner* — Suresh Suryawanshi
(74) *Attorney, Agent, or Firm* — Ishimaru & Associates LLP

(57) ABSTRACT

A method of manufacture of a computing system includes: executing a first application, active and implemented as hardware within a hardware component having of one or more of reconfigurable hardware devices; detecting a trigger event in a first microkernel; generating a first hardware descriptor based on the trigger event, the first hardware descriptor to configure a portion of the hardware component for the first application or a second application; and configuring the portion of the hardware component with the first hardware descriptor while the first application executes concurrently.

20 Claims, 10 Drawing Sheets

COMPUTING SYSTEM WITH HARDWARE SCHEDULED RECONFIGURATION MECHANISM AND METHOD OF OPERATION THEREOF

CROSS-REFERENCE TO RELATED APPLICATION

This application claims the benefit of U.S. Provisional Patent Application Ser. No. 61/483,523 filed May 6, 2011, and the subject matter thereof is incorporated herein by reference in its entirety.

TECHNICAL FIELD

The present invention relates generally to a computing system and more particularly to a system for hardware reconfiguration.

BACKGROUND ART

Electronic hardware with integrated circuits is used in virtually all electronic equipment today and have revolutionized the world of electronics. The integrated circuits are used in digital computing systems, such as computers, televisions, cellular phones, mobile devices, and digital video cameras.

The integrated circuits that enable virtually every electronics gadget used on a daily basis are constantly being pushed by the semiconductor industry to become faster. However, pure hardware implementation does not allow the flexibility to address the myriad of applications in modern computing system.

Thus, a need still remains for computing systems with flexibility of more functions as well as increased speed. In view of the increasing demand for computing systems with improved integration and performance, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a computing system, including: executing a first application, active and implemented as hardware within a hardware component having of one or more of reconfigurable hardware devices; detecting a trigger event in a first microkernel; generating a first hardware descriptor based on the trigger event, the first hardware descriptor to configure a portion of the hardware component for the first application or a second application; and configuring the portion of the hardware component with the first hardware descriptor while the first application executes concurrently.

The present invention provides a computing system, including: a hardware component for executing a first application, active and implemented as hardware within the hardware component having of one or more of reconfigurable hardware devices; a trigger event handler for detecting a trigger event in a first microkernel; a scenario formulation unit for generating a first hardware descriptor based on the trigger event, the first hardware descriptor to configure a portion of the hardware component for the first application or a second application; and a schedule formulation unit for configuring the portion of the hardware component with the first hardware descriptor while the first application executes concurrently.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The term "module" referred to herein includes hardware in the present invention in accordance with the context in which the term is used. For example, the hardware can include circuitry, programmable circuitry, computer, integrated circuit, integrated circuit cores, a pressure sensor, an inertial sensor, a microelectromechanical system (MEMS), passive devices, or a combination thereof.

Figure 1:
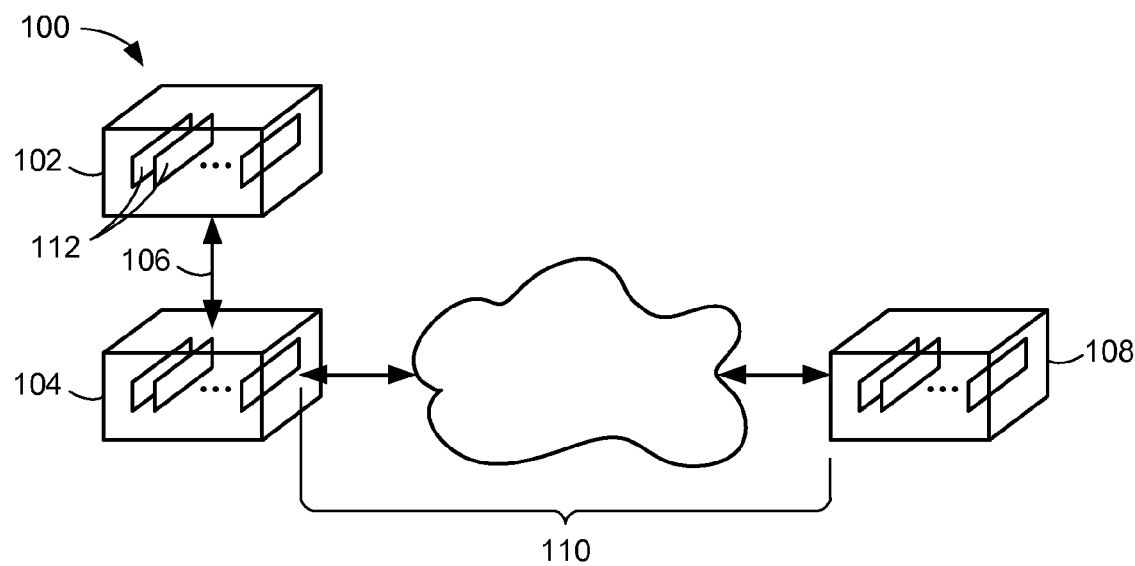
FIG. 1 is a computing system with hardware reconfiguration mechanism in an embodiment of the present invention.

Referring now to FIG. 1, therein is shown a computing system 100 with hardware reconfiguration mechanism in an embodiment of the present invention. The computing system 100 can represent an adaptive architecture execution environment.

The computing system 100 can include a first electronic equipment 102 connected to a second electronic equipment 104 through a first communication path 106. The computing system 100 can include a third electronic equipment 108 connected to the second electronic equipment 104 through a second communication path 110.

For example, the first electronic equipment 102, the second electronic equipment 104, or the third electronic equipment 108 can represent a non-mobile device or a mobile device. As specific examples, the first electronic equipment 102, the second electronic equipment 104, or the third electronic equipment 108 can be a server, a server farm, a computer, a grid-computing resource, a virtualized computer resource, a cloud computing resource, a router, a switch, a peer-to-peer distributed computing device, a network equipment, a storage enclosure, or a combination thereof As additional specific examples, the first electronic equipment 102, the second electronic equipment 104, or the third electronic equipment 108 can be a cellular phone, a personal digital assistant, a notebook computer, a multi-functional mobile communication device, or an entertainment device.

The first communication path 106, as an example, can represent a wireless network, a wired network, or a combination thereof for box-to-box connectivity. The first communication path 106 can include wireless communication, wired communication, optical, ultrasonic, or a combination thereof Bluetooth, Infrared Data Association standard (IrDA), wireless fidelity (WiFi), and worldwide interoperability for microwave access (WiMAX) are examples of wireless communication for the first communication path 106. Ethernet, Fiber Channel, and Peripheral Component Interconnect (PCI) are also examples of wired communication for the first communication path 106.

The second communication path 110, for example, can represent a wireless network, a wired network, or a combination thereof for connectivity over a network. The second communication path 110 can include wireless communication, wired communication, optical, ultrasonic, cloud network, or a combination thereof Satellite communication, cellular communication, Bluetooth, Infrared Data Association standard (IrDA), wireless fidelity (WiFi), and worldwide interoperability for microwave access (WiMAX) are examples of wireless communication for the second communication path 110. Ethernet, digital subscriber line (DSL), fiber to the home (FTTH), and plain old telephone service (POTS) are also examples of wired communication for the second communication path 110.

Further, the second communication path 110 can traverse a number of network topologies and distances. For example, the second communication path 110 can include direct connection, personal area network (PAN), local area network (LAN), metropolitan area network (MAN), wide area network (WAN), or a combination thereof. Also for example, the second communication path 110 can support timing requirements or quality of service (QoS) features.

Each of the first electronic equipment 102, the second electronic equipment 104, and the third electronic equipment 108 can include a number of line cards 112, which are defined as modular electronic sub-systems. The line cards 112 can be connected together on a backplane or with cables for inside-a-box connectivity. The line cards 112 can be connected together using connectivity methods including electrical connectors, optical fiber connectors, or wave-guide connectors.

The line cards 112 can include an electronic component including an application-specific integrated circuit (ASIC), a field-programmable gate array (FPGA). For example, the line cards 112 can represent server blades, expansion cards, or interface cards for routers or switches.

Figure 2:
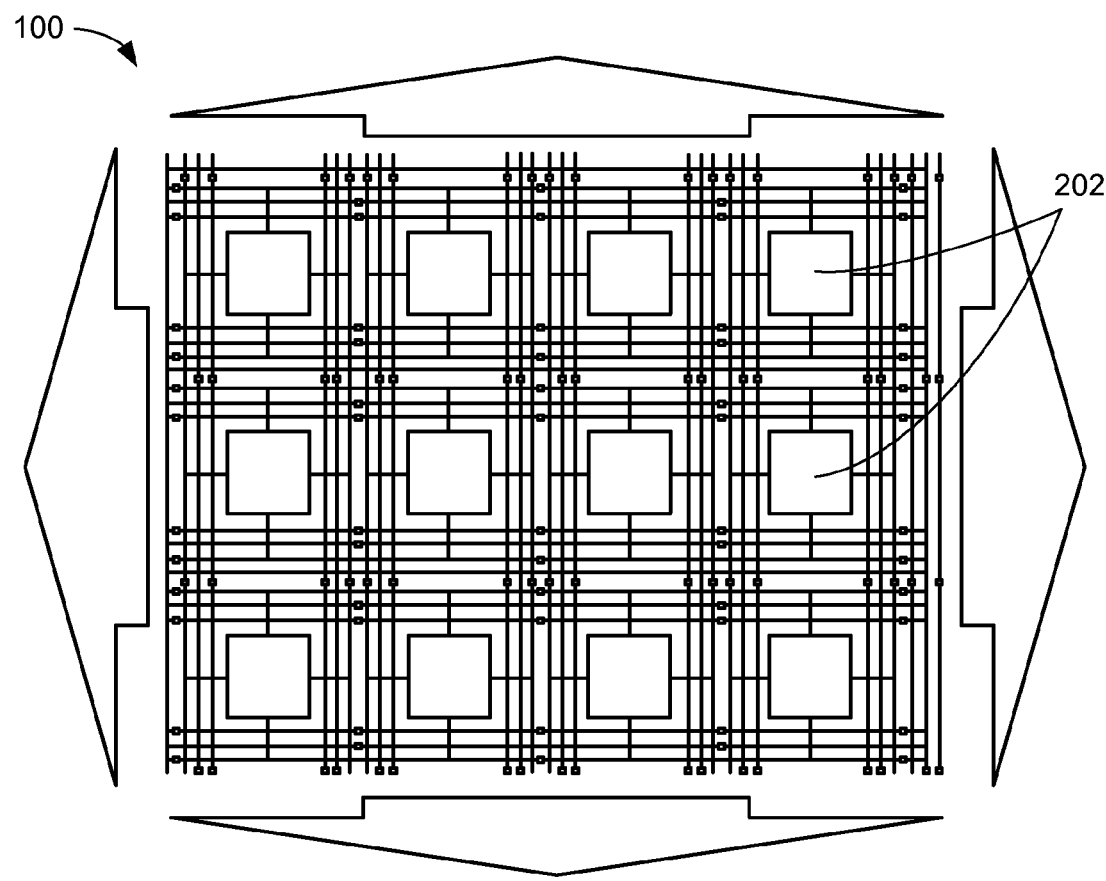
FIG. 2 is an architecture diagram of the computing system.

Referring now to FIG. 2, therein is shown an architecture diagram of the computing system 100. The computing system 100 can include a number of reconfigurable hardware devices 202. The reconfigurable hardware devices 202 are defined as programmable devices in which functionality of logic gates or units is customizable thereby providing a capability to dynamically change functions within the programmable devices.

The reconfigurable hardware devices 202 can represent the programmable devices with a configurable pool of programmable blocks and reconfigurable interconnects. For example, the reconfigurable interconnects can represent wires or zero-delay interconnection resources. The architecture diagram is depicted with arrows to indicate that any number of the reconfigurable hardware devices 202 can be placed, routed, and interconnected.

Placement, routing, and interconnections among a number of the reconfigurable hardware devices 202 can be configurable at run-time. A number of the reconfigurable hardware devices 202 can be placed and routed to interconnect or interface to one another on one or more of the line cards 112 of FIG. 1.

For example, the reconfigurable hardware devices 202 can represent the programmable devices including field-programmable gate arrays (FPGAs), programmable logic devices (PLDs), or any other programmable hardware devices. Also for example, the reconfigurable hardware devices 202 can represent target programmable devices. Further, for example, interconnections between the reconfigurable hardware devices 202 can represent the first communication path 106 of FIG. 1, the second communication path 110 of FIG. 1, a backplane, or with cables for inside-a-box connectivity.

Figure 3:
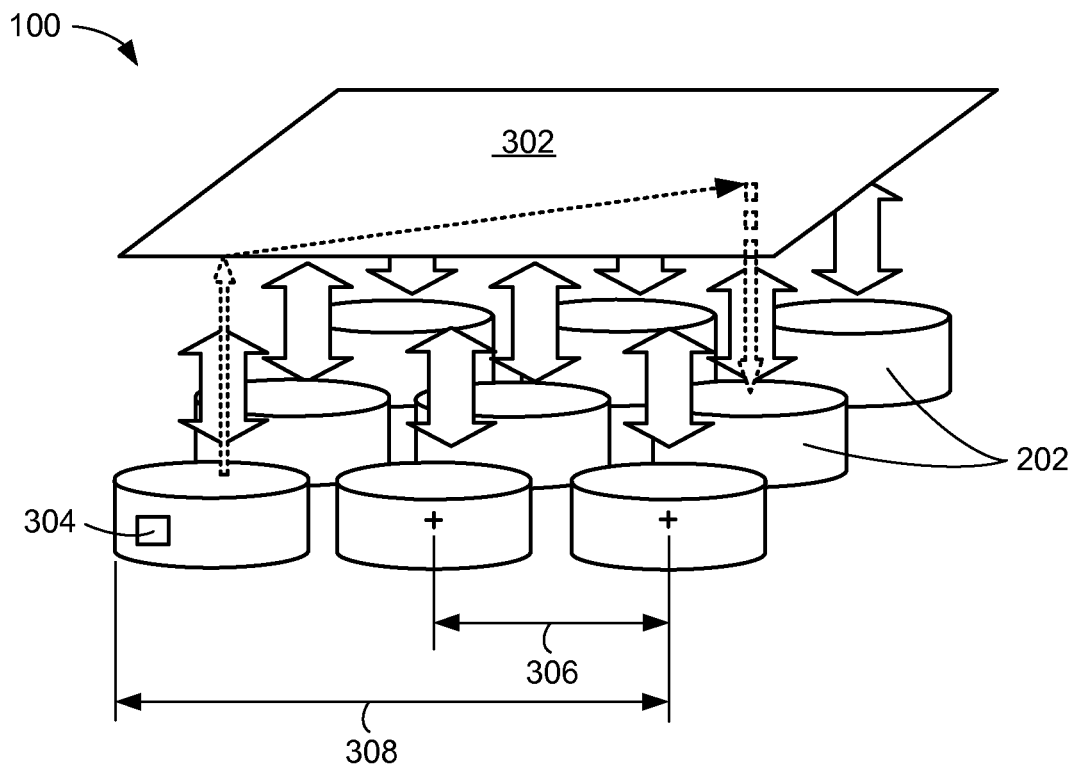
FIG. 3 is a connection diagram of a cross-connection network of the reconfigurable hardware devices.

Referring now to FIG. 3, therein is shown a connection diagram of a cross-connection network 302 of the reconfigurable hardware devices 202. The connection diagram depicts a hierarchical connection that enables the reconfigurable hardware devices 202 to be interconnected. The cross-connection network 302 is defined as an interconnection of hardware resources.

One of the reconfigurable hardware devices 202 can interface to another of the reconfigurable hardware devices 202 through the cross-connection network 302 in a path shown with dash arrows. For example, the cross-connection network 302 can represent the interconnections between the reconfigurable hardware devices 202.

Delay incurred by traversing the cross-connection network 302 can be regulated by managing a number of hierarchical levels in the cross-connection network 302 at implementation time. The implementation time is a time when the reconfigurable hardware devices 202, the line cards 112 of FIG. 1, and a combination thereof are connected together through the cross-connection network 302 before the reconfigurable hardware devices 202 and the line cards 112 are available for operation.

The delay can also be regulated by managing a locality of an application 304 at run-time. The application 304 is defined as a process that is to be launched by a user and executed by the reconfigurable hardware devices 202 in the computing system 100. For illustration purposes, one of the reconfigurable hardware devices 202 is shown to execute the application 304, although it is understood that any number of the reconfigurable hardware devices 202 can be allocated to execute the application 304.

The locality can be provided by mapping the application 304 to one of the reconfigurable hardware devices 202 or multiple of the reconfigurable hardware devices 202 that are within a predetermined distance 306 from each other. The predetermined distance 306 is a distance between centers of the reconfigurable hardware devices 202 that that is less than a distance threshold 308 to ensure a propagation delay less than a fixed numerical value. The distance threshold 308 is a predefined numerical value for determining whether the reconfigurable hardware devices 202 are locally or closely located to each other.

The cross-connection network 302 can include management functions to be effective. A number of the application 304 can discreetly avail themselves of network management functionality through a control interface, leaving complex network maintenance to logic that operates separately from the number of the application 304.

A single application management approach can pre-empt or prevent occurrences of mismatched approaches, which are multiple methods of a variety of sub-systems having conflicting effects in an overall system. The single application management approach provides a single coordination to ensure resources are available for use.

For example, the occurrences can include resource leakage, resource collision, resource starvation, application deadlock, namespace conflict, cross-thread run-time synchronization failure, and cross-thread communication disconnect. As a specific example, the resource leakage occurs when applications do not use the resources available. As another specific example, the resource collision occurs when multiple devices or processes access the same instances of the resources.

As another specific example, the resource starvation occurs when the resources are not allocated for execution of a process because they are used for execution of another process having a higher priority than the process. As another specific example, the application deadlock occurs when two or more processes are simultaneously waiting for each other to free up the resources.

Application logic that is not able to be fit or implemented into a single instance of the reconfigurable hardware devices 202 can require application synchronization at device input ports of each of the reconfigurable hardware devices 202 that are used to implement and execute the application logic. Multiple approaches to the application synchronization can be supported assuming orthogonal application domains, which are groups of applications that are different and operate independently from each other.

The number of the application 304 can coexist in the computing system 100 and therefore can use the same system resources including a memory control interface (not shown) and a network control interface (not shown). Consistency of the application synchronization that applies the same terms and protocols can promote application independence and therefore scalability.

Figure 4:
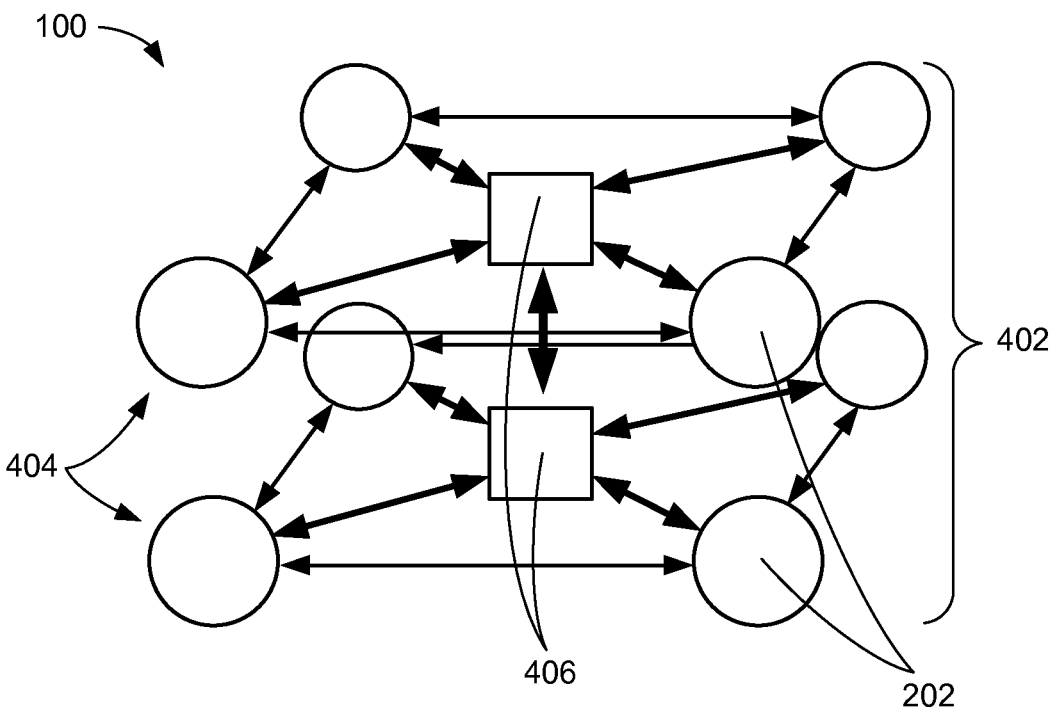
FIG. 4 is a connection diagram of a tandem kernel of the computing system.

Referring now to FIG. 4, therein is shown a connection diagram of a tandem kernel 402 of the computing system 100. The tandem kernel 402 is defined as more than one of clusters 404 connected together. Each of the clusters 404 is defined as a collection of the reconfigurable hardware devices 202 connected to kernel units 406, whereby the reconfigurable hardware devices 202 are locally located with respect to one another.

The term "locally located" refers to the reconfigurable hardware devices 202 within the predetermined distance 306 of FIG. 3 from one another. The computing system 100 can include a number of the clusters 404 connected together through a number of the kernel units 406. Each of the kernel units 406 is defined as a management hardware that includes application management, communication, and synchronization functionality.

The connection diagram depicts the tandem kernel 402 having a first of the kernel units 406 connected to a second of the kernel units 406, with each of the first of the kernel units 406 and the second of the kernel units 406 having four instances of the reconfigurable hardware devices 202. Within the tandem kernel 402, one of the reconfigurable hardware devices 202 of the first of the kernel units 406 can interface with one of the reconfigurable hardware devices 202 of the second of the kernel units 406.

One of the reconfigurable hardware devices 202 can interface with another of the reconfigurable hardware devices 202 within one of the clusters 404 preferably through one of the kernel units 406 of the one of the clusters 404. Optionally, one of the reconfigurable hardware devices 202 coupled to a first microkernel of one of the clusters 404 can interface directly with another of the reconfigurable hardware devices 202 coupled to a second microkernel of the one of the clusters 404. A number of the kernel units 406 and interconnections between the reconfigurable hardware devices 202 and the number of the kernel units 406, each including a microkernel among the number of the kernel units 406, among the reconfigurable hardware devices 202, or a combination thereof can represent portions of the cross-connection network 302 of FIG. 3.

It has been discovered that each of the clusters 404 having one of the kernel units 406 provides improved dynamic allocation of hardware resources because the application 304 of FIG. 3 can be fragmented, mapped, and executed with any number of the reconfigurable hardware devices 202 interface with each other through the one of the kernel units 406.

It has also been discovered that any number of the reconfigurable hardware devices 202 directly interface with each other within one of the clusters 404 provides improved performance with less delays through direct connections as well as provides reduced cost and complexity.

Figure 5:
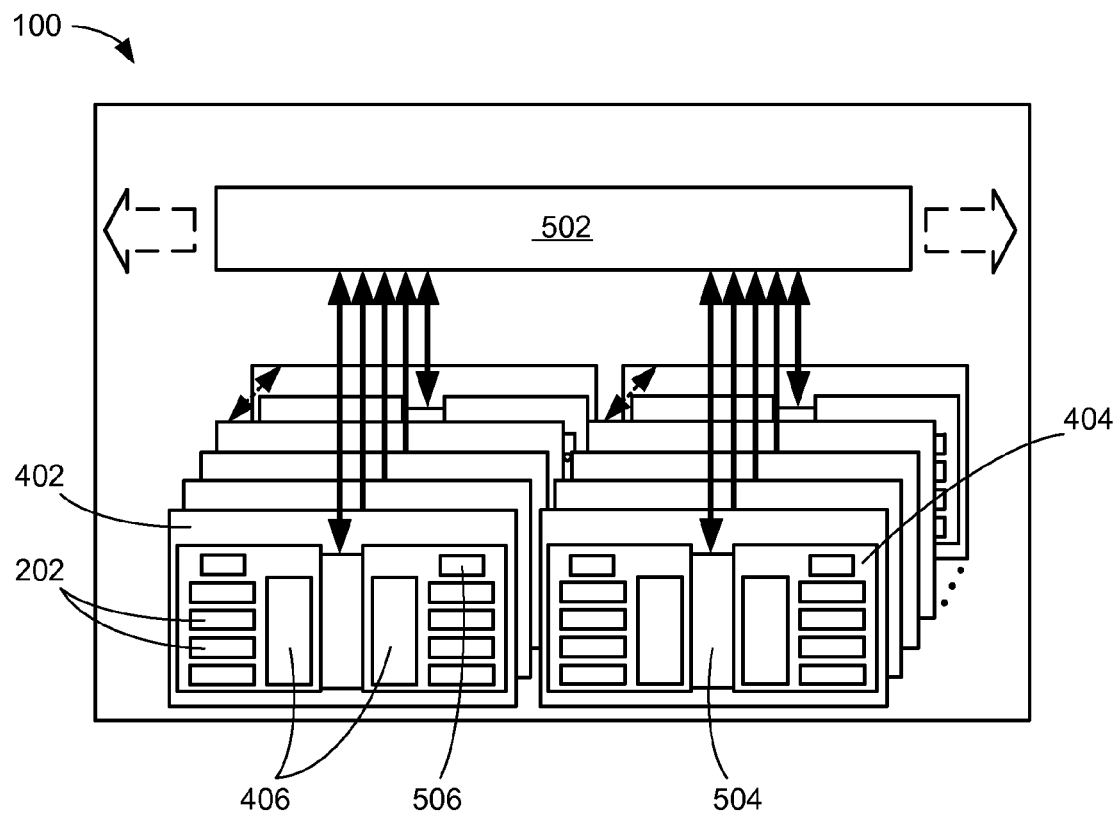
FIG. 5 is a hardware block diagram of the computing system.

Referring now to FIG. 5, therein is shown a hardware block diagram of the computing system 100. The computing system 100 includes a hardware platform with a number of the kernel units 406, a number of the reconfigurable hardware devices 202, and a communication network 502 that can be engaged and interworking altogether as a system.

The computing system 100 includes a dynamic reconfigurable computing platform without any external software intervention during real-time operation. For example, the computing system 100 can provide a complete hardware platform.

The communication network 502 provides an interface and connectivity for the tandem kernel 402 to communicate with another of the tandem kernel 402. The communication network 502 can include switches and communication protocols for sending information and data between one of the kernel units 406 of the tandem kernel 402 to one of the kernel units 406 of another of the tandem kernel 402.

The tandem kernel 402 can include a communication interface 504 to provide communication between the tandem kernel 402 and another of the tandem kernel 402. The communication interface 504 can also provide communication between one of the kernel units 406 and another of the kernel units 406. For example, the communication interface 504 can represent a network interface.

The communication interface 504 can be used for one of the kernel units 406 of the tandem kernel 402 to communicate with one of the kernel units 406 of another of the tandem kernel 402 through the communication network 502. The communication network 502, the communication interface 504, a number of the kernel units 406, or a combination thereof can represent portions of the cross-connection network 302 of FIG. 3. For example, a number of the tandem kernel 402 can be included on a number of the line cards 112 of FIG. 1. Also for example, a number of the tandem kernel 402 can represent the first electronic equipment 102 of FIG. 1, the second electronic equipment 104 of FIG. 1, or the third electronic equipment 108 of FIG. 1.

The computing system 100 can accommodate a number of different models of the reconfigurable hardware devices 202, each of which can include different input/output (I/O) densities and different computing resources. Suitability of the reconfigurable hardware devices 202 can depend on an application descriptor 506, which is defined as information regarding a make-up or an attribute of the application 304 of FIG. 3 that determines how the reconfigurable hardware devices 202 are to be allocated for implementing the application 304. The application descriptor 506 can include resource requirements for implementing the application 304 of FIG. 3.

The application descriptor 506 can include the operation feature including input/output-intensive (I/O-intensive) or compute-intensive, among other characteristics. For example, the application descriptor 506 can be used to determine a mix of the application 304.

I/O-intensive refers to the application 304 that is preferably mapped to programmable hardware resources with a high I/O activity. The high I/O activity refers to a number of input and output ports of a programmable hardware resource greater than a predefined numerical value of input and output ports. For example, the predefined numerical value of input and output ports can be 600. Also for example, I/O-intensive can represent I/O-heavy or high I/O density.

Compute-intensive refers to the application 304 that is preferably mapped to programmable hardware resources with a high compute resource capacity. Compute-intensive applies to the application 304 that demands a lot of computation compared to I/O-intensive that requires more input/output operations.

The application 304 that is I/O-intensive can be placed, routed, and executed more efficiently using a selected model of the reconfigurable hardware devices 202 that is designed for I/O-intensive applications than those for compute-intensive applications. The application 304 that is compute-intensive can be placed, routed, and executed more efficiently using a different model of the reconfigurable hardware devices 202 that is designed for resource-intensive than those for I/O-intensive.

The computing system 100 can be tuned or configured by mixing the clusters 404 differently based on the application descriptor 506. The clusters 404 can represent kernel planes. For example, the application descriptor 506 of the application 304 can be particularly I/O-intensive but the application 304 has compute-intensive ancillary functionality that is most frequently unused.

In the example above, the clusters 404 populated with high I/O density instances of the reconfigurable hardware devices 202 can be employed for execution of basic functionality of the application 304. In addition, the clusters 404 populated with compute resource intensive instances of the reconfigurable hardware devices 202 can be employed for execution of the compute-intensive ancillary functionality that is swapped in and out of the compute resource intensive instances of the reconfigurable hardware devices 202.

Each of the clusters 404 can be analyzed to estimate an amount of time for implementing a functionality of the application 304 based on an actual capacity (or size) and an actual I/O density of the reconfigurable hardware devices 202 that are used to map the application 304. As an application mix of a number of the application 304 runs in the computing system 100, performance can be measured and a mix of the clusters 404 can be adjusted according to actual run-time characteristics. The application mix refers to the number of the application 304 that need to be mapped to resources that are I/O-intensive, compute-intensive, or a combination thereof.

Placement of the clusters 404 can depend on the application mix. If an I/O-intensive functionality of the application 304 is localized in the reconfigurable hardware devices 202, the clusters 404 that are I/O-intensive can be clustered together, thereby decongesting the communication network 502 of the computing system 100. If an I/O-intensive functionality of the application 304 functions as a hub for a compute-intensive functionality, the clusters 404 that are I/O-intensive can be distributed amongst the clusters 404 that are compute-intensive.

Figure 6:
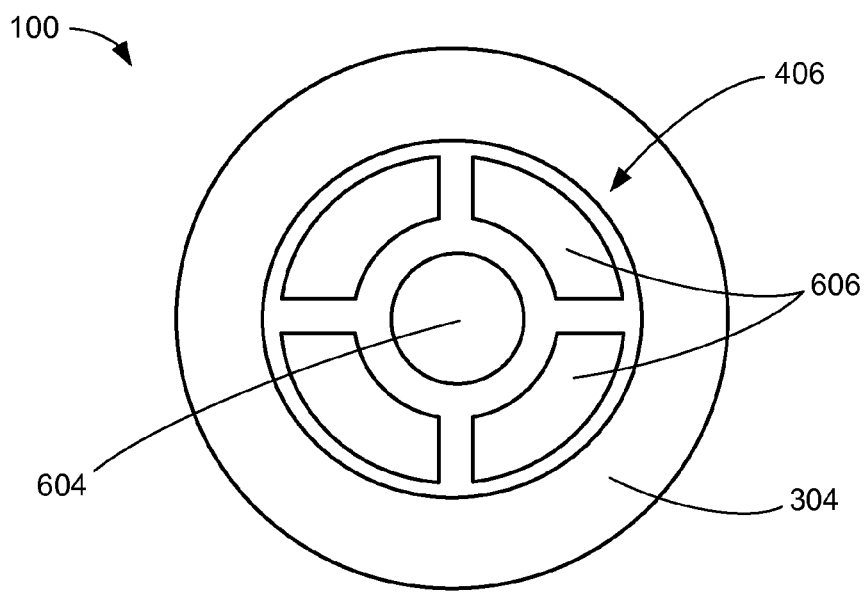
FIG. 6 is an architecture diagram of the application in the computing system.

Referring now to FIG. 6, therein is shown an architecture diagram of the application 304 in the computing system 100. Each of the kernel units 406 can include a microkernel 604 and kernel modules 606. The microkernel 604 can provide control, management, and communication capabilities for each of the kernel units 406 to interface and connect with the reconfigurable hardware devices 202 of FIG. 2 to implement and execute functionality of the application 304.

The kernel modules 606 augment functionality of the microkernel 604 by providing additional control and management capabilities that are not implemented in the microkernel 604. The kernel units 406 can be configured for the application 304 by compiling and synthesizing the kernel modules 606 expressly chosen for an application domain of the application 304. The application 304 can be loaded and executed on the reconfigurable hardware devices 202.

The application domain refers to a type of a number of the application 304 that are grouped based on similar functionalities. The application domain depends on problems that the number of the application 304 is implemented to solve. For example, the application domain can include encryption, computer vision, and synthetic-aperture radar that can be supported with high-performance computing functionalities implemented in the number of the application 304.

The application 304 can be launched in a layer outside each of the kernel units 406 having the microkernel 604 and the kernel modules 606. For example, the application 304 can be developed using a programming language including C++ and VHSIC hardware description language (VHDL) where VHSIC stands for very-high-speed integrated circuits. Also for example, the application 304 can be developed with Open Computing Language (OpenCL) programs and compiled to run with an execution platform with only hardware using the reconfigurable hardware devices 202.

The application 304 can be mapped to and executed by the reconfigurable hardware devices 202. A method of mapping and implementing a representation or a bitstream of the application 304 can be managed by each of the kernel units 406 with the microkernel 604 and the kernel modules 606.

Figure 7:
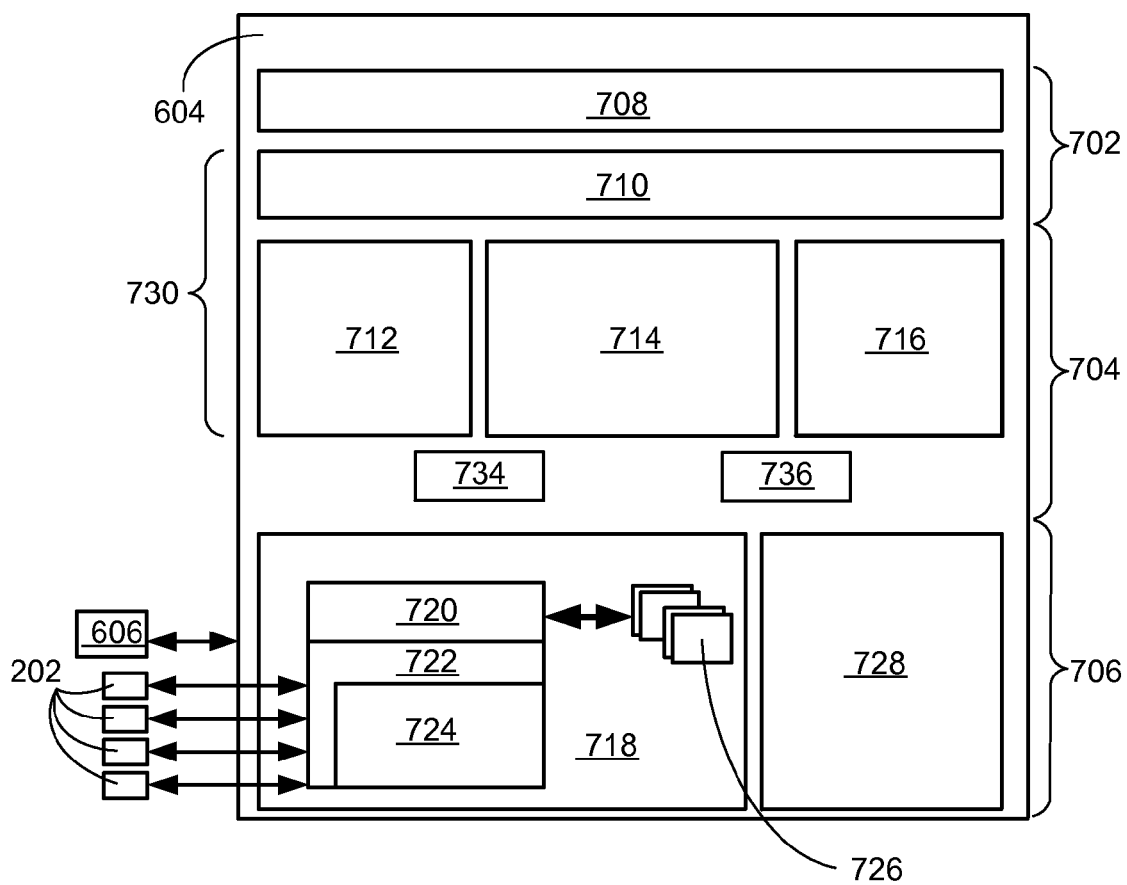
FIG. 7 is a hardware block diagram of the microkernel.

Referring now to FIG. 7, therein is shown a hardware block diagram of the microkernel 604. The microkernel 604 can be implemented with vital functions common to various types of a number of the application 304 of FIG. 3 that operates in a similar fashion across all application domains. The microkernel 604 operates with the kernel modules 606.

The microkernel 604 can include operation functions including communications, logic multiplexing, security primitives, job scheduling, and distributed control. The microkernel 604 is an interworking hardware system of sub-functions, organized as shown in FIG. 7. The microkernel 604 can include the sub-functions that are stratified into three layers including a control layer 702, a support layer 704, and a run-time layer 706.

The control layer 702 performs a job control and includes a microkernel interface (not shown). The control layer 702 can include a user interface unit 708 and an application manager 710 for performing control functions including session management, control plane security, and job scheduling.

The support layer 704 provides scheduling support and network management. The support layer 704 can include a module manager 712, a resource manager 714, and an event manager 716 for performing support functions including scenario validation, event handling, and remote kernel interface management.

The run-time layer 706 provides an application run-time plant. The run-time layer 706 can include run-time blocks including an intra-cluster communication unit 718 having a buffer manager 720 and a virtual bus 722 with a switch fabric 724. The run-time layer 706 can include the run-time blocks including a number of memory devices 726 and an inter-cluster communication unit 728. The run-time layer 706 can include the run-time blocks for performing run-time functions including interfacing with the reconfigurable hardware devices 202 and performing application fragment interconnect, signal management, network interface, and network and application interface security.

The microkernel 604 can include a schedule engine 730 for scheduling portions of a number of the reconfigurable hardware devices 202. The schedule engine 730 can include the application manager 710, the module manager 712, the resource manager 714, and the event manager 716 to support the scheduling.

Sub-blocks of the control layer 702, the support layer 704, and the run-time layer 706 can be connected to each other, the reconfigurable hardware devices 202, and the kernel modules 606. The control layer 702 can interface with the kernel modules 606 and the support layer 704. The support layer 704 can interface with the control layer 702 and the run-time layer 706. The run-time layer 706 can interface with the support layer 704, the reconfigurable hardware devices 202, and the kernel modules 606.

The microkernel 604 can be implemented as a functional foundation for the computing system 100 of FIG. 1, upon which the application 304 can be built such that the application 304 is secure and seamless. The microkernel 604 can embody a coherent collection of functionality appropriate for implementing the application 304.

The microkernel 604 can provide primitives that implement functionality including application module 734 scheduling and maintenance, seamless application fragment interaction, and high-performance application communication. The term "primitives" refers to a simple operation for executing a relatively more complex operation than the simple operation. For example, the primitives can represent low-level commands that are used to execute relatively high-level commands.

For example, the application module 734 scheduling and maintenance can include thread maintenance 736 and module swapping. Also for example, the seamless application fragment interaction can include interconnection and synchronization.

The thread maintenance 736 monitors instantaneous needs of the application 304 and regulates allocation of resources to the application 304. The thread maintenance 736 is performed for multiple applications or processes.

For example, the thread maintenance 736 can monitor the instantaneous application needs of the application 304 and allocate ancillary logic of the reconfigurable hardware devices 202 that has been swapped out to be used by the application 304. The term "ancillary" refers to spare logic gates that are swapped in to implement a function and swapped out to be available to implement another function when the spare logic gates are subsequently needed. Also for example, the thread maintenance 736 can determine that a pipeline stall associated with feedback can require treatment.

The module swapping circumscribes or includes functionality associated with process scheduling including networked database support, identification of appropriate application fragment, run-time application fragment place and route, attachment and registration of application fragment alarms, and intra-application fragment signal handling configuration.

For the seamless application fragment interaction, the microkernel 604 can facilitate run-time synchronization at application grain boundaries including flow-control management of pipeline stalls involving pipelines that span the application grain boundaries. The term "fragment" refers to a portion of the application 304.

The microkernel 604 can also provide for bus interconnection and reliable delivery of application signal information from outputs to fanned-out inputs at application fragment grain boundaries. The application fragment grain boundaries are perimeters of groups or portions of programmable blocks in the reconfigurable hardware devices 202 of the clusters 404 of FIG. 4, where interconnects or wires are connected between the groups.

For the high-performance application communication, the microkernel 604 can provide a low-overhead communication infrastructure to the application 304 developed as any combination of software and hardware on top of or outside the microkernel 604 and the kernel modules 606. Wrappers or interfaces for the application 304 can be written in hardware or software outside the microkernel 604 and the kernel modules 606 to seamlessly adapt the low-overhead communication infrastructure to a number of protocols.

Figure 8:
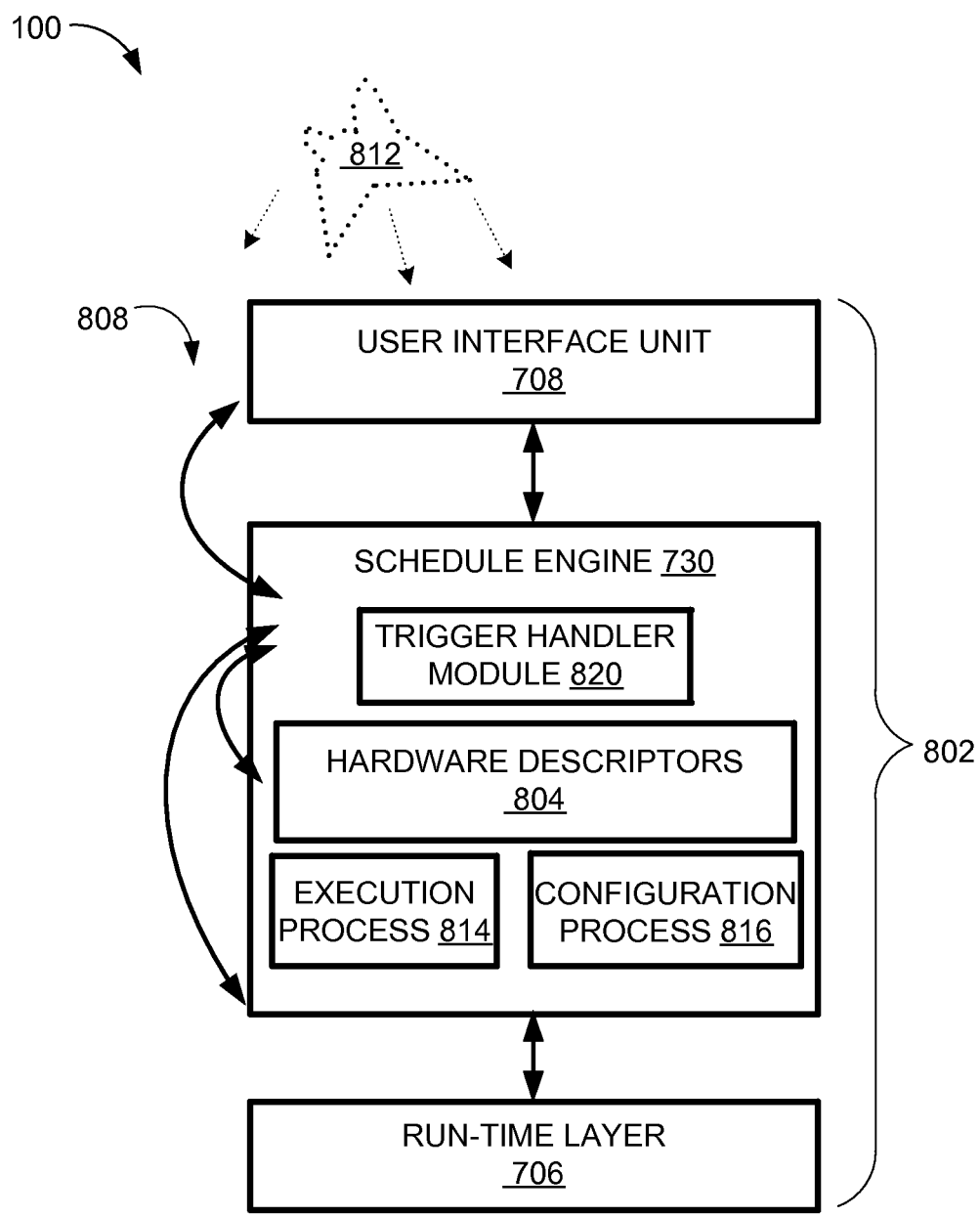
FIG. 8 is an architecture diagram of a configuration engine of the computing system.

Referring now to FIG. 8, therein is shown an architecture diagram of a configuration engine 802 of the computing system. The configuration engine 802, formed entirely of hardware, is embedded within the microkernel 604 of FIG. 7 and the configuration engine 802 includes the schedule engine 730 and has schedule interfaces attached or connected to the user interface unit 708 and the run-time layer 706 of the microkernel 604.

The configuration engine 802 of the microkernel 604 generates hardware descriptors 804. The hardware descriptors 804 can also be referred to as a hardware descriptor stored in memory devices that are local to the configuration engine 802, remotely networked and located anywhere within the computing system 100, or a combination thereof. The hardware descriptors 804 can include more than one hardware descriptor having parameters and data used to configure or reconfigure the reconfigurable hardware devices 202 of FIG. 2, the interconnections between the reconfigurable hardware devices 202, or the interconnections between the reconfigurable hardware devices 202 and the computing system 100.

The schedule engine 730 manages execution processes 814 or configuration processes 816 used to reconfigure the reconfigurable hardware devices 202 or any interconnections with the reconfigurable hardware devices 202. The schedule engine 730, for example, can manage the interconnections between the reconfigurable hardware devices 202, between the reconfigurable hardware devices 202 and electronic hardware (not shown) in the computing system 100, or a combination thereof.

The execution processes 814 are defined as operations executed or initiated in hardware by the schedule engine 730 to add, suspend, delete, reconfigure, partition, consolidate, activate, stop, sequence, or order tasks of the schedule engine 730 used to perform the operations. The configuration processes 816 are defined as tasks of the schedule engine 730 executed, initiated, or controlled in hardware by the schedule engine 730 to generate the hardware descriptors 804 and an initial relative or absolute timing of the tasks to be executed.

More than one portion of the execution processes 814 or of the configuration processes 816 can be simultaneously managed by the schedule engine 730 in parallel, series, or a combination thereof The simultaneously management of the execution processes 814 or of the configuration processes 816 by the schedule engine 730 results in multiple hardware threads 808, hardware processes, or a combination thereof The schedule engine 730 can activate or start each of the execution processes 814 or the configuration processes 816 sequentially, overlapping, or separated from one another in a synchronous or asynchronous timed relationship to one another. The schedule engine 730 can also activate or start each of the execution processes 814 or the configuration processes 816 in a synchronous, monotonic, or random frequency of time.

Trigger events 812, shown and represented with dotted lines, can originate from one or more multiple sources in the computing system 100 to activate portions of the schedule engine 730, of the microkernel 604 in the clusters 404, from a quiescent state to initiate one or more of the execution processes 814 or the configuration processes 816. The trigger events 812 in the microkernel 604 can be requests initially received by the user interface unit 708, the run-time layer 706, the event manager 716 of FIG. 7, or any other networked functional portion of the computing system 100.

The trigger events 812 can be generated as a result of an occurrence of another of the application 304 of FIG. 3, a fault or error detected, a request for hardware resources, or any combination thereof The trigger events 812 can also result from a task to optimize the system resource or time utilization for at least one of the execution processes 814 or the configuration processes 816 active and non-quiescent.

A trigger handler module 820 in the schedule engine 730 can be used to detect the trigger events 812. The trigger handler module 820 can be used to indicate a need to generate one or more of the hardware descriptors 804 for a scheduled job, as described in FIG. 7, based on or the result of the trigger events 812.

Optimization of the system resource can include partition or consolidation of any hardware locally or remotely available, parallel or concurrent use of the hardware threads 808, use of multiple hardware pipeline, or reuse/sharing of hardware or data used by the hardware to generate the hardware descriptors 804. The optimization of the system resources can be further augmented with runtime utilization adjustments that can include modifications of duration, sequence order, or interleaved time window.

For illustrative purposes, the configuration engine 802 is shown having the schedule engine 730, the user interface unit 708, and the run-time layer 706. It is understood that the configuration engine 802 can be integrated or configured differently. For example, the schedule engine 730 can be partitioned and configured into two or more individual units.

Figure 9:
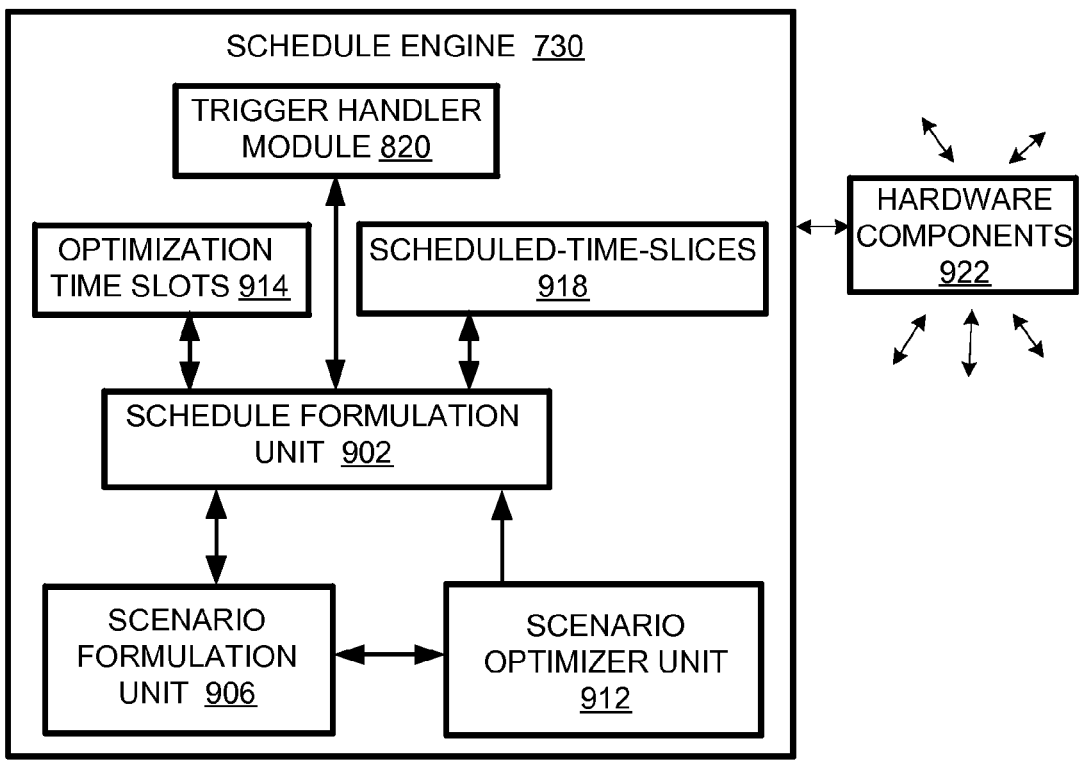
FIG. 9 is an architecture diagram of the schedule engine of FIG. 8.

Referring now to FIG. 9, therein is shown an architecture diagram of the schedule engine 730 of FIG. 8. The schedule engine 730 can include a schedule formulation unit 902 of the application manager 710 of FIG. 7, a scenario formulation unit 906 of the module manager 712 of FIG. 7, and a scenario optimizer unit 912 of the resource manager 714 of FIG. 7.

The schedule formulation unit 902 can allocate and assign one or more optimization time slots 914 allocated for the generation of the hardware descriptors 804 and chosen to prevent unintentional overlapping with the generation of any other of the hardware descriptors 804. The optimization time slots 914 are defined as periods in time allocated for the purpose of placing, routing, and connecting the circuitry and the interconnects of the hardware components 922.

The hardware components 922 are defined as hardware surrounding the microkernel 604 of FIG. 6 of each of the kernel units 406 of FIG. 4. For example, the hardware components can include the reconfigurable hardware devices 202, interconnects attached directly to the reconfigurable hardware devices 202, any hardware used to network between two or more of the clusters 404, or any combination thereof.

The schedule formulation unit 902 receives alerts of the trigger events 812 of FIG. 8 from the trigger handler module 820 in the schedule engine 730 of the configuration engine 802 of FIG. 8. The schedule formulation unit 902 prioritizes, stages, or manages activities of the schedule engine 730 to process each of the trigger events 812 and generation of the hardware descriptors 804 of FIG. 8. The schedule formulation unit 902 can stage or manage generating, releasing, decimating, suspending, activating, or a combination thereof of one or more of the hardware descriptors 804 identifying, configuring, or personalizing the hardware components 922 associated with the hardware descriptors 804.

The hardware components 922 reserved or allocated to any of the hardware descriptors 804 can either be allocated or unassigned and not allocated for use or service at any specific point in time. The schedule formulation unit 902 manages, schedules, and assigns scheduled-time-slices 918 for activities such as execution, transitioning hardware states, or transitioning of the hardware components 922 in response to the trigger events 812.

The scheduled-time-slices 918 establish or designate execution timeframes and the scheduling activities of the hardware components 922. The scheduling activities can include times to configure, allocate, terminate, activate, suspend, change priority, decimate, commit, abort, augment, consolidate, disperse, change permission, relocate, or any combination thereof of any of the hardware components 922 designated by any of the hardware descriptors 804. The scheduled-time-slices 918 can be based on each of the activities generated in response to each of the trigger events 812 to be executed, processed, or performed by the schedule engine 730.

The schedule formulation unit 902 also evaluates each of the trigger events 812 and determines, allocates, assigns, and partitions portions of the hardware components 922 that are available for use in each of the scheduled-time-slices 918. The schedule formulation unit 902 can periodically and dynamically re-evaluates the activities relating to the hardware descriptors 804, the scheduled-time-slices 918, and the hardware components 922. The schedule formulation unit 902 can, adjust the scheduling of resources for maximum usage and efficiency for the schedule engine 730 and remaining hardware of the computing system 100.

The schedule formulation unit 902 can also release, decimate, suspend, activate, or a combination thereof any of the hardware components 922 while retaining or preserving their corresponding the hardware descriptors 804 for further reuse with all or portions of the hardware components 922. The schedule formulation unit 902 can provide communication connections or pipelines with locally or networked hardware within the computing system 100.

The communication connections can be used to augment, share, or provide substitute resources that may be unavailable in areas within the microkernel 604 or in another of the microkernel 604 within the computing system 100 lacking resources. The scenario formulation unit 906 of the module manager 712 of FIG. 7 and the scenario optimizer unit 912 of the resource manager 714 of FIG. 7 are responsible for hardware optimizations used in placement, routing, and producing the circuitry represented and specified by the hardware descriptors 804.

The hardware optimization process is defined as activities, tasks, and processes involved or required to place, the route, and define the circuitry of the hardware descriptors 804. The schedule formulation unit 902 supervises the scenario formulation unit 906. The activities of the scenario formulation unit 906 stages data feeds or pipelines to the scenario optimizer unit 912 and databases buffers within the computing system 100 to enable multiples of the hardware threads 808 of FIG. 8 for use in the optimization or generation of the hardware descriptors 804.

The scenario optimizer unit 912 is a slave to the scenario formulation unit 906 and is a routing facility having local storage and scheduling and placement specific hardware. The scenario optimizer unit 912 pre-screens, directs, flows, and process data and information to for use in the optimization processes based on constraints of specific scenarios or alternate constraints.

The scenario optimizer unit 912 ensures the process data and information are distributed and kept distinct on each pipe and isolated from one another. The scenario optimizer unit 912 also maintains individual synchronization for each pipeline used for placement and routing information for each of the hardware descriptors 804 active in the optimization time slots 914.

For illustrative purposes, the schedule engine 730 is shown having the schedule formulation unit 902, the scenario formulation unit 906, and the scenario optimizer unit 912. It is understood that the schedule engine 730 can be integrated or configured differently. For example, the scenario formulation unit 906, and the scenario optimizer unit 912 can be combined into a single unit.

It has been discovered that the schedule formulation unit 902, the scenario formulation unit 906, and the scenario optimizer unit 912 ensure maximum resource utilization of the computing system 100 at all times.

It has been discovered that the schedule formulation unit 902, the scenario formulation unit 906, and the scenario optimizer unit 912 prevents complete loss of resources to any active processes or pipelines resulting in superior resource availability and utilization at all times.

Figure 10:
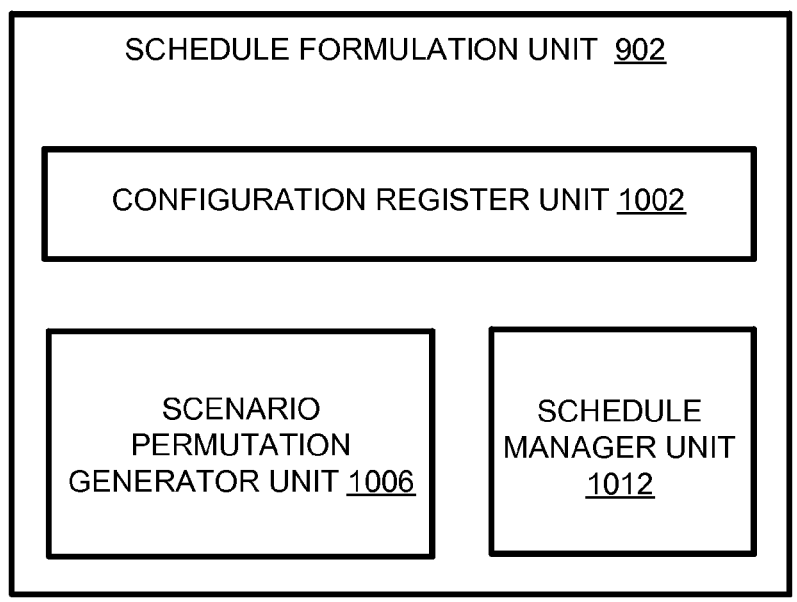
FIG. 10 is a hardware block diagram of the schedule formulation unit of FIG. 9.

Referring now to FIG. 10, therein is shown a hardware block diagram of the schedule formulation unit 902 of FIG. 9. The schedule formulation unit 902 can include configuration register unit 1002, a scenario permutation generator unit 1006, and a schedule manager unit 1012.

The configuration register unit 1002 contains state information of the optimization, such as process states and parameters, used to set-up and bound parametric ranges for optimization processing used to generate the hardware descriptors 804 of FIG. 8. The scenario permutation generator unit 1006 prepares the parameterization of paths based on the information in the configuration register unit 1002.

The schedule manager unit 1012 manages the optimization by coordinating movement of the information from the configuration register unit 1002 to the scenario permutation generator unit 1006 to format and filter in each of the optimization time slots 914 of FIG. 9. The schedule manager unit 1012 sends the formatted output from the scenario permutation generator unit 1006 to the scenario formulation unit 906 of FIG. 9.

For illustrative purposes, the schedule formulation unit 902 is shown having the configuration register unit 1002, the scenario permutation generator unit 1006, and the schedule manager unit 1012. It is understood that the schedule formulation unit 902 can be integrated or configured differently. For example, the configuration register unit 1002 and the schedule manager unit 1012 can be combined into a single unit.

It has been discovered that the configuration register unit 1002, the scenario permutation generator unit 1006, and the schedule manager unit 1012 ensure maximum resource utilization of the computing system 100 at all times.

It has been discovered that the configuration register unit 1002, the scenario permutation generator unit 1006, and the schedule manager unit 1012 prevents complete loss of resources to any active processes or pipelines resulting in superior resource availability and utilization at all times.

Figure 11:
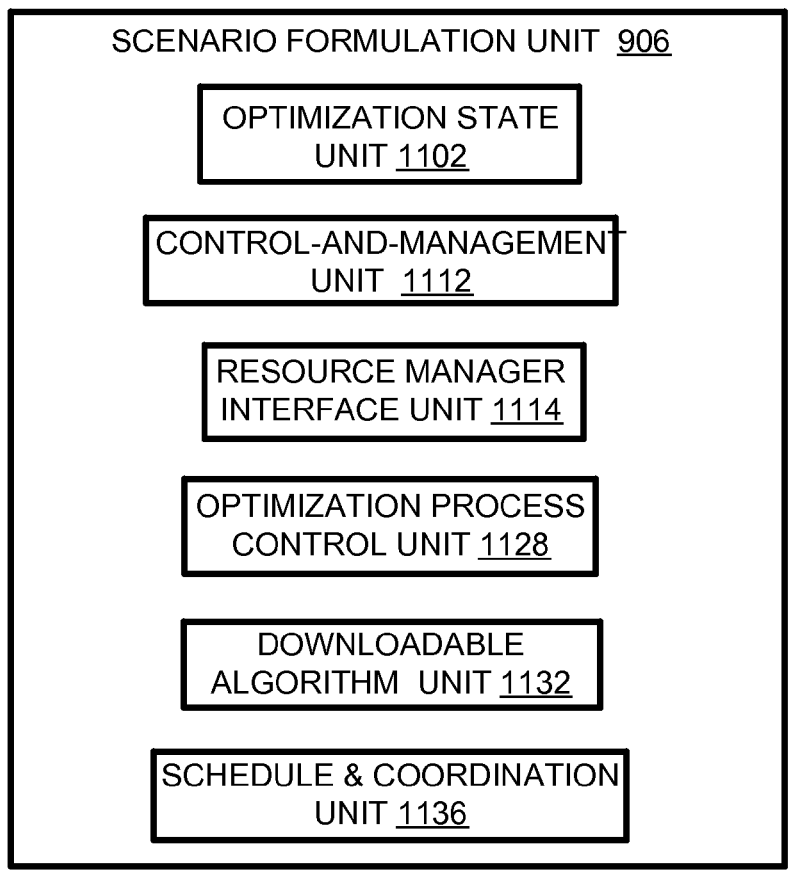
FIG. 11 is a hardware block diagram of the scenario formulation unit of FIG. 9.

Referring now to FIG. 11, therein is shown a hardware block diagram of the scenario formulation unit 906 of FIG. 9. The scenario formulation unit 906 can include an optimization state unit 1102, a control-and-management unit 1112, a resource manager interface unit 1114, an optimization process control unit 1128, a downloadable algorithm unit 1132, and a schedule and coordination unit 1136.

The optimization state unit 1102 manages and tracks the progression of simulation or synthesis of the hardware optimization process and the completion of whole or segmented tasks. The control-and-management unit 1112 manages and directs the requests and set-up of the hardware units within the scenario formulation unit 906. The resource manager interface unit 1114 includes local storage used to provide base and variable parameter values and parametric settings for each optimization task or each of the hardware threads 808 of FIG. 8 required for the optimizations.

The optimization process control unit 1128 is an optimization centric controller dedicated to perform low level adjustments and tunings on a pipeline—by—pipeline and optimization task—by—optimization task basis to achieve user preselected desired solutions. The downloadable algorithm unit 1132 is a vast compilation of different algorithms, such as mathematical equations, statistical relationships, or Boolean relationships, used by the scenario formulation unit in the hardware optimization process.

The schedule and coordination unit 1136 provides connectivity to a network that can be within, outside of the scenario formulation unit 906, or extending beyond the microkernel 604 of FIG. 6 into the computing system 100 of FIG. 1. The network of the schedule and coordination unit 1136 enables sharing of the hardware components 922 and hardware units with any other block, engine, layer, or unit having access to the network within the computing system 100.

For illustrative purposes, the scenario formulation unit 906 is shown having the optimization state unit 1102, the control-and-management unit 1112, the resource manager interface unit 1114, the optimization process control unit 1128, the downloadable algorithm unit 1132, and the schedule and coordination unit 1136. It is understood that the scenario formulation unit 906 can be integrated or configured differently. For example, the optimization state unit 1102, the control-and-management unit 1112, and the schedule and coordination unit 1136 can be combined into a single unit.

It has been discovered that the optimization state unit 1102, the control-and-management unit 1112, the resource manager interface unit 1114, the optimization process control unit 1128, the downloadable algorithm unit 1132, and the schedule and coordination unit 1136 ensure maximum resource utilization of the computing system 100 at all times.

It has been discovered that the optimization state unit 1102, the control-and-management unit 1112, the resource manager interface unit 1114, the optimization process control unit 1128, the downloadable algorithm unit 1132, and the schedule and coordination unit 1136 prevents complete loss of resources to any active processes or pipelines resulting in superior resource availability and utilization at all times.

Figure 12:
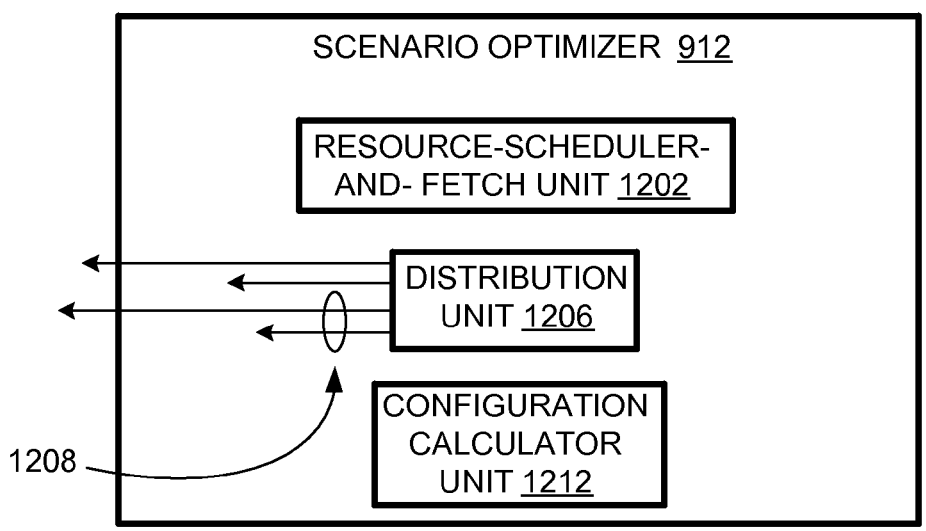
FIG. 12 is a hardware block diagram of the scenario optimizer unit of FIG. 9.

Referring now to FIG. 12, therein is shown a hardware block diagram of the scenario optimizer unit 912 of FIG. 9. The scenario optimizer unit 912 includes a resource-scheduler-and-fetch unit 1202, a distribution unit 1206, and a configuration calculator unit 1212.

The resource-scheduler-and-fetch unit 1202 schedules the pipeline with streaming data from databases in local storage of the scenario optimizer unit 912 or from network connections 1208 managed by the distribution unit 1206. The network connections 1208 can include one or more of the hardware threads 808 of FIG. 8, pipelines, or pipelines having the hardware threads 808. The resource-scheduler-and-fetch unit 1202 fetches, handshakes, the exchange of optimization parameters between the databases and the scenario optimizer unit 912

The distribution unit 1206 is a fast and efficient crossbar switch having capabilities of multicasting data synchronously and managing of handshaking of pipelines and multiples of the hardware threads 808 between resources of the computing system 100 of FIG. 1. The configuration calculator unit 1212 determines and validates fit and configurability of place and route pipeline, containing bitstreams, for each of the hardware descriptors 804 and the reconfigurable hardware devices 202 allocated and corresponding to each of the hardware descriptors 804.

For illustrative purposes, the scenario optimizer unit 912 is shown having the resource-scheduler-and-fetch unit 1202, the distribution unit 1206, and the configuration calculator unit 1212. It is understood that the scenario optimizer unit 912 can be integrated or configured differently. For example, the distribution unit 1206 and the configuration calculator unit 1212 can be combined into a single unit.

It has been discovered that the scenario formulation unit 906 of FIG. 11 and the scenario optimizer unit 912 having the network connections 1208 managed by the distribution unit 1206 provides full utilization and availability of all of the hardware components 922 of FIG. 9 throughout the computing system 100 at all times.

Figure 13:
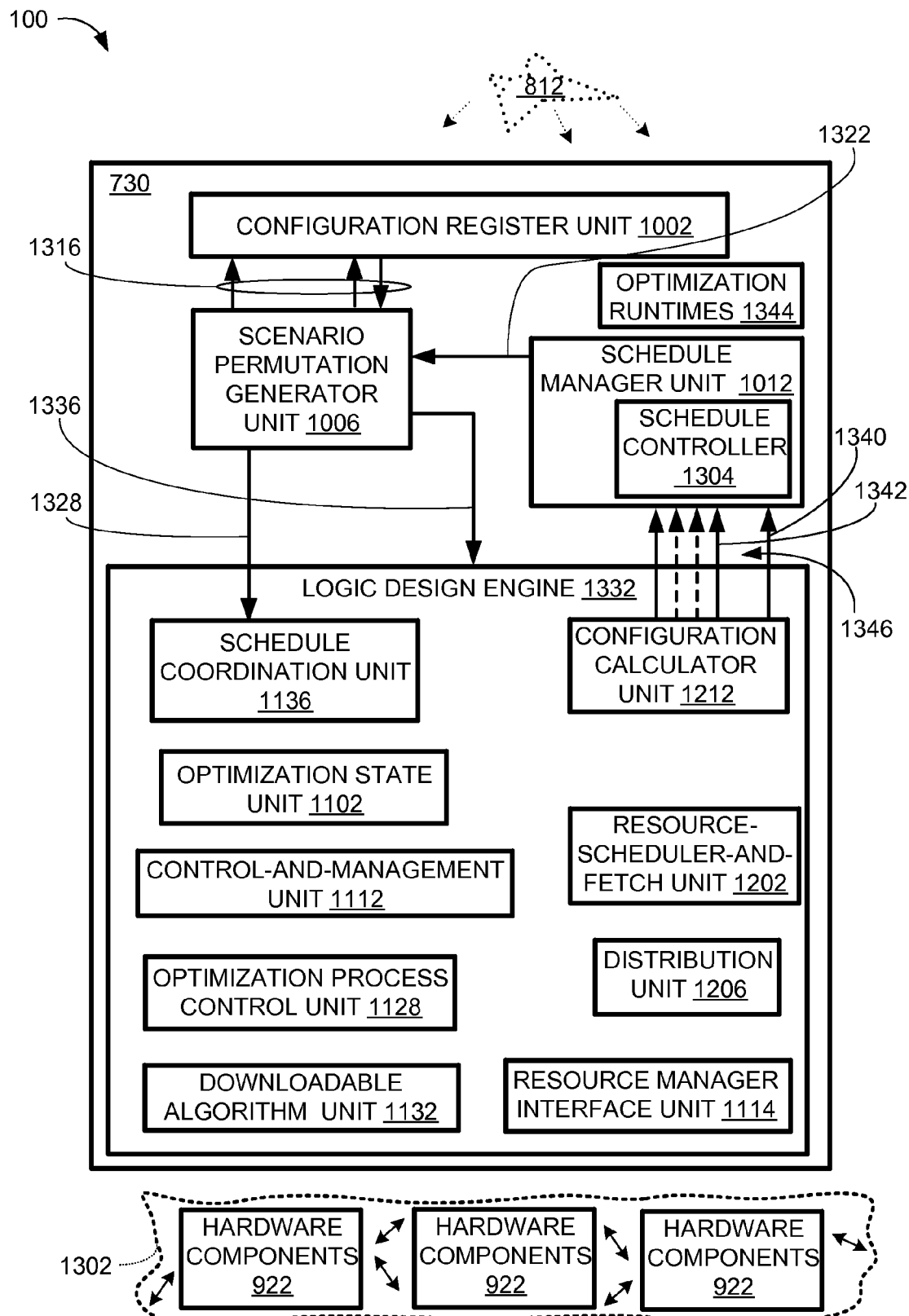
FIG. 13 is a detailed diagram of the schedule engine of FIG. 9.

Referring now to FIG. 13, therein is shown a detailed diagram of the schedule engine 730 of FIG. 9. The schedule engine 730 detects each of the trigger events 812 and can be filter to sort and prioritize responses based on order, urgency, or availability of resources needed for each of the responses.

In a first example, a first trigger event such as one of the trigger events 812 received from the configuration engine 802 of FIG. 8, the event manager 716 of FIG. 7, or any other functional portion of the computing system 100 can initiate activities of the schedule manager unit 1012 used for the generation of the hardware descriptors 804 of FIG. 8. The schedule engine 730 can filter and prioritize each of the trigger events 812. The hardware components 922 that are available and unreserved can be reserved or allocated in preparation for generation of the hardware descriptors 804.

The hardware descriptors 804 can be used for configuring at least a portion of one or more of the reconfigurable hardware devices 202 of FIG. 2 that collectively are based on priorities of the trigger events 812 determined by the schedule engine 730 and a dynamic resource pool 1302, shown and represented with dotted lines. The dynamic resource pool 1302 is defined as a collection of all of the hardware components 922 within the computing system 100 that can be accessed by the microkernel 604 of FIG. 6.

The hardware components 922 of FIG. 9 in the dynamic resource pool 1302 can at any time change in status as-well-as availability. For example, the number of the hardware components 922 that are allocated or reserved versus free and available is directly dependent on quantity of the hardware descriptors 804 and changes that include additions, deletions, or modifications to the hardware descriptors 804. The hardware components 922 can be locally or remotely networked to one another using the reconfigurable hardware devices 202.

The schedule manager unit 1012 includes a schedule controller 1304 that queries local buffers in the configuration register unit 1002 and any networked buffer memories connected through interfaces of the schedule and coordination unit 1136. Networked buffer memories external to or the local buffers within the schedule engine 730 can contain lists of the hardware descriptors 804 that have been previously reserved or allocated.

The schedule controller 1304 can use the lists of the hardware descriptors 804 to determine which of the hardware components 922 are available and can be reserved or allocated in response to the first trigger event received. The schedule controller 1304 allocates portions of the reconfigurable hardware devices 202 in one or more of the hardware components 922 and selects the scheduled-time-slices 918 of FIG. 9, such as activation-time-slices that are available to be allocated for the first trigger event.

The activation-time-slices are defined as intervals in time and duration of time periods corresponding to activation of the hardware components 922 that can include the reconfigurable hardware devices 202. The activation of the hardware components 922 is defined as a period of the hardware components 922 which starts when an initial bitstream is sent to the hardware components 922 for reconfiguration and ends when the hardware components 922 are released, decimated, inoperative, and in need of reconfiguration before use.

Parameters and parametric ranges settings in the configuration register unit 1002 can be read or updated by the scenario permutation generator unit 1006 using a parameter-pipelined interface 1316. The parameters, the parametric ranges, dynamic scenario parameters 1322, or any combination thereof can be used in a logic design processes for generating the hardware descriptors 804 and can be transferred from the configuration register unit 1002 to the scenario permutation generator unit 1006 under control of the schedule controller 1304.

The dynamic scenario parameters 1322 are variable settings sent to the scenario permutation generator unit 1006 from the schedule manager unit 1012. The dynamic scenario parameters 1322 are used to expedite, improve, or assist the scenario permutation generator unit 1006 in the generation of the hardware descriptors 804.

The logic design processes can include identification, placement, and routing of hardware devices, circuits, transistors, and interconnects or pipes using the hardware components 922 that have been allocated and reserved by the schedule manager unit 1012. The scenario permutation generator unit 1006 generates at least one factor profile 1328 for a memory database of the schedule and coordination unit 1136 that can be frequently accessed and used for multiple concurrent hardware place and route pipelines.

The schedule and coordination unit 1136, the configuration calculator unit 1212, the optimization state unit 1102, the control-and-management unit 1112, the optimization process control unit 1128, the downloadable algorithm unit 1132, the resource manager interface unit 1114, the resource-scheduler-and-fetch unit 1202, and the distribution unit 1206 can collectively be referred to as a logic design engine 1332. The logic design engine 1332 can receive scenario data 1336 generated by the scenario permutation generator unit 1006 from transformations of the parameters, the parametric ranges, and the dynamic scenario parameters 1322 from the schedule manager unit 1012.

The configuration calculator unit 1212 of the logic design engine 1332 can generate adjustment parameters 1340 to tune the factor profile 1328 which influences the scenario data 1336 used to generate different descriptor solutions 1342 for consideration as one of the hardware descriptors 804 in one of the optimization time slots 914 of FIG. 9. Optimization runtimes 1344 of the scenario permutation generator unit 1006 can be used to adjust, increase, or decrease elapsed interval times spent by the logic design engine 1332 in processing and for generating the hardware descriptors 804 during any one of the optimization time slots 914.

The optimization runtimes 1344 are defined as total elapsed times a specified hardware unit or block within the schedule engine 730 is active and operating during one of the optimization time slots 914. The optimization runtimes 1344 can be recorded in buffers for each hardware unit or block in the schedule engine 730 for the schedule manager unit 1012 to track and monitor as needed.

The optimization runtimes 1344 can be adjusted dynamically based on priority changes detected by the schedule manager unit 1012 from the trigger events 812, activities, or statuses within the computing system 100. The schedule manager unit 1012, without any external intervention, can manage the effort or time expenditure for each optimization thread active in the logic design engine 1332 without external intervention using the optimization runtime. The descriptor solutions 1342 previously generated can be sent to the schedule manager unit 1012 for comparisons, reuse, selection, or assignment to any of the scheduled-time-slices 918.

The schedule manager unit 1012 determines if each of the descriptor solutions 1342 will meet the requirements necessary for each the hardware descriptors 804 and saved, further processing or optimization should be attempted, the descriptor solutions 1342 should be saved and cataloged for reuse, the descriptor solutions 1342 be discarded and replaced and reattempted using a different process or optimization. Any of the descriptor solutions 1342 chosen by the schedule manager unit 1012 to be further processed or optimized without external intervention.

The descriptor solutions 1342 chosen to be re-optimized can be processed with modifications to the factor profile 1328, the scenario data 1336, the dynamic scenario parameters 1322, or any combination thereof. The descriptor solutions 1342 chosen to be further processed can be repartitioned, fragmented, consolidated or any combination thereof. Fragmentation of the descriptor solutions 1342 can be chosen by the schedule manager unit 1012 and performed by partitioning each fragmented portions or segment of the descriptor solutions 1342 into separate optimization threads 1346 of the schedule engine 730.

It has been discovered that the dynamic scenario parameters 1322, the factor profile 1328, the scenario data 1336, the adjustment parameters 1340 intrinsic and architected into the schedule engine 730 generates configurable hardware faster, having better electrical performance, and with fewer hardware resources than manual user, computer, or software controlled reconfigurable hardware system.

In a second example, a second trigger event, such as one of the trigger events 812 immediately following the first trigger event, can be received by the schedule engine 730 that requires an increase in quantities of the hardware components 922 beyond what is available and unassigned. The schedule controller 1304 determines that none of the hardware components 922 are available within the scheduled-time-slices 918 required by the second trigger event and requires the generation of another one of the hardware descriptors 804.

The schedule manager unit 1012 can assign a higher priority to the generation of the hardware descriptors 804 of the second trigger event than the generation of the hardware descriptors 804 for the first trigger event by assigning or re-ordering the optimization time slots 914. The assigning or re-ordering of the optimization time slots 914 can be based on the priorities determined by the schedule manager unit 1012. Once the hardware descriptors 804 for the first trigger event and the second trigger event have been generated, the schedule manager unit 1012 can re-evaluate the order used to configure and activate the hardware components 922 defined by the hardware descriptors 804.

The schedule manager unit 1012 examines and determines that the second trigger event with a higher priority should be serviced first by rescheduling some of the scheduled-time-slices 918 that are associated with the first trigger event and not yet serviced. The schedule manager unit 1012 can create resource openings and the scheduled-time-slices 918 for the second trigger event.

The schedule manager unit 1012 can initiate the generation of the hardware descriptors 804 to address the second trigger event based on a reconfiguration of portions of the hardware components 922 previously allocated for the first trigger event in one of the optimization time slots 914. The schedule manager unit 1012 can also initiate one of the hardware threads 808 of FIG. 8, in parallel or concurrent with the generation of the hardware descriptors 804 for the second trigger event, to generate the hardware descriptors 804 for the first trigger event.

The hardware descriptors 804 for the first trigger event can re-allocate a similar or different combination of the hardware components 922 in the one of the optimization time slots 914 used to generate the hardware descriptors 804 for the second trigger event. The hardware descriptors 804 for the first trigger event can be restarted or resumed to service the first trigger event in one of the scheduled-time-slices 918 following all of the scheduled-time-slices 918 addressing the second trigger event.

The schedule manager unit 1012 can suspend and optionally decimate the hardware components 922 for one or more of the scheduled-time-slices 918 of the first trigger event activities prior to generating the hardware descriptors 804 for the second trigger event. The suspension can include flow control of bitstreams to receiving hardware units, residual draining of pipelines directed to the receiving hardware, and optionally recording of residual or transitory states and transfer counters at residual bitstream boundaries.

The schedule manager unit 1012 can release all interconnect, cached memory, and release cache resources in preparation for the scheduled-time-slices 918 and the hardware descriptors 804 allocated to service the second trigger event. The hardware threads 808 allocated in parallel or concurrent for the generation of the hardware descriptors 804 to service the first trigger event can be assigned and scheduled in an upcoming window of the scheduled-time-slices 918 or re-assigned again depending on the trigger events 812 and their priorities.

It has been discovered that the scenario permutation generator unit 1006, the configuration register unit 1002, the schedule manager unit 1012, and the logic design engine 1332 provides configurable scalability of pipelines and the hardware threads 808 to service any number of the trigger events 812 to ensure full utilization of all the hardware components 922 at all times in the computing system 100.

It has been discovered that the scenario permutation generator unit 1006, the configuration register unit 1002, the schedule manager unit 1012, and the logic design engine 1332 eliminates starvation or stagnant service responses to any of the trigger events 812 by proactively managing the use of the scheduled-time-slices 918, multiple pipelining, multiple use of the hardware threads 808, and reconfigurability of the hardware components 922 without intervention from outside the computing system 100.

It has been discovered that the scenario permutation generator unit 1006, the configuration register unit 1002, the schedule manager unit 1012, and the logic design engine 1332 provides scalable and variable pipeline capacities to enable optimization of the pipelines for maximum speed or efficiency for responsive responses to any of the trigger events 812.

In a third example, the schedule manager unit 1012 can initiate, without external intervention, three of the hardware threads 808 in parallel or concurrent in the logic design engine 1332 and all active in one of the optimization time slots 914. Activities of the hardware threads 808 in three parallel or concurrent can include generation of a first hardware descriptor, a second hardware descriptor, and a third hardware descriptor in response to the first trigger event, the second trigger event, and a third trigger event, respectively.

The first hardware descriptor, the second hardware descriptor, and the third hardware descriptor are different and can use different portions of the hardware components 922 within the hardware descriptors 804 networked within the computing system 100. Scheduling of the generation of the second hardware descriptor can have a high priority, the first hardware descriptor can have a priority lower the priority of the second hardware descriptor, and the third hardware descriptor can have a priority lower than the priorities of the first hardware descriptor and the second hardware descriptor.

The schedule manager unit 1012, without external intervention and based on the priorities, can independently configure the logic design engine 1332 to allocate a majority of execution time or support resources, such as buffers, pipelines, or the hardware threads 808, into the generation of the second hardware descriptor within one of the optimization time slots 914. The schedule manager unit 1012 can configure the logic design engine 1332 to allocate minimum amounts of execution time or resources into the generation of the third hardware descriptor.

The schedule manager unit 1012 can also configure the logic design engine 1332 to allocate an amount of execution time or resources for the generation of the first hardware descriptor to be greater than the minimum amounts set for the execution time or the resources for the generation of the third hardware descriptor. The generation of the first hardware descriptor, the second hardware descriptor, and the third of the hardware descriptor can be scheduled to execute together within one of the optimization time slots 914 by partitioning the total available execution time or resources in a non-overlapped manner based on the individual priorities determined by the schedule manager unit 1012.

It has been discovered that the schedule manager unit 1012 initiates and manages without external intervention the individual priorities or execution times within the schedule engine 739 provides superior utilization of support resources or maximum operating efficiency of the computing system 100.

It has been discovered that the schedule manager unit 1012 initiates and manages, without external intervention, the individual priorities of the hardware threads 808 concurrently for the trigger events 812 and the logic design engine 1332 for the generation of more than one of the hardware descriptors 804 within any one of the optimization time slots 914, provides superior utilization of support resources and maximum operating efficiency of the computing system 100.

It has been discovered that the schedule manager unit 1012 initiates and manages, without external intervention, the individual execution times of the hardware threads 808 concurrently for the trigger events 812 and the logic design engine 1332 for the generation of the hardware descriptors 804 within any one of the optimization time slots 914, provides superior utilization of support resources and maximum operating efficiency of the computing system 100.

In a fourth example, the schedule manager unit 1012 can initiate, without external intervention, all three of the hardware threads 808 in parallel or concurrent in the logic design engine 1332 and all active in one of the optimization time slots 914. Activities of the three of the hardware threads 808 can include generation of a first hardware descriptor, a second hardware descriptor, and a third hardware descriptor in response to the first trigger event, the second trigger event, and a third trigger event, respectively.

The schedule manager unit 1012, based on availability of the hardware components 922 and without external intervention, can allocate one or more common portions of the hardware components 922 within the hardware descriptors 804 shared to the first hardware descriptor, the second hardware descriptor, and the third hardware descriptor. The schedule manager unit 1012 can update the factor profile 1328 or the scenario data 1336 to the logic design engine 1332 to produce at least one common hardware partition that is to be shared by the first hardware descriptor, the second hardware descriptor, and the third hardware descriptor.

The common hardware partition can be created into a fourth hardware descriptor different from the first hardware descriptor, the second hardware descriptor, and the third hardware descriptor. The fourth hardware descriptor can be assigned to be active in parallel or concurrent with the scheduled-time-slices 918 of the first hardware descriptor, the second hardware descriptor, or the third hardware descriptor, as needed. The fourth hardware descriptor can be shared with the first hardware descriptor, the second hardware descriptor, or the third hardware descriptor as a result of the schedule manager unit 1012 managing the generation of the hardware descriptors 804 and allocation of the scheduled-time-slices 918.

Generation of the fourth hardware descriptor of the hardware descriptors 804 could be fragmented and partitioned into more than one of the hardware threads 808 by the schedule manager unit 1012, without external intervention. The schedule manager unit 1012 uses the one of the hardware threads 808 to perform parallel or concurrent optimizations for each partition followed by a single partition consolidation and assignment into the scheduled-time-slices 918 of the first hardware descriptor, the second hardware descriptor, or the third hardware descriptor, as needed.

It has been discovered that the schedule manager unit 1012, scheduling and managing without external intervention, generating one of the hardware descriptors 804 with capabilities to be included and reused with different ones the hardware descriptors 804 in one slice of the scheduled-time-slices 918 results in improved usage and availability of the optimization hardware resources.

Figure 14:
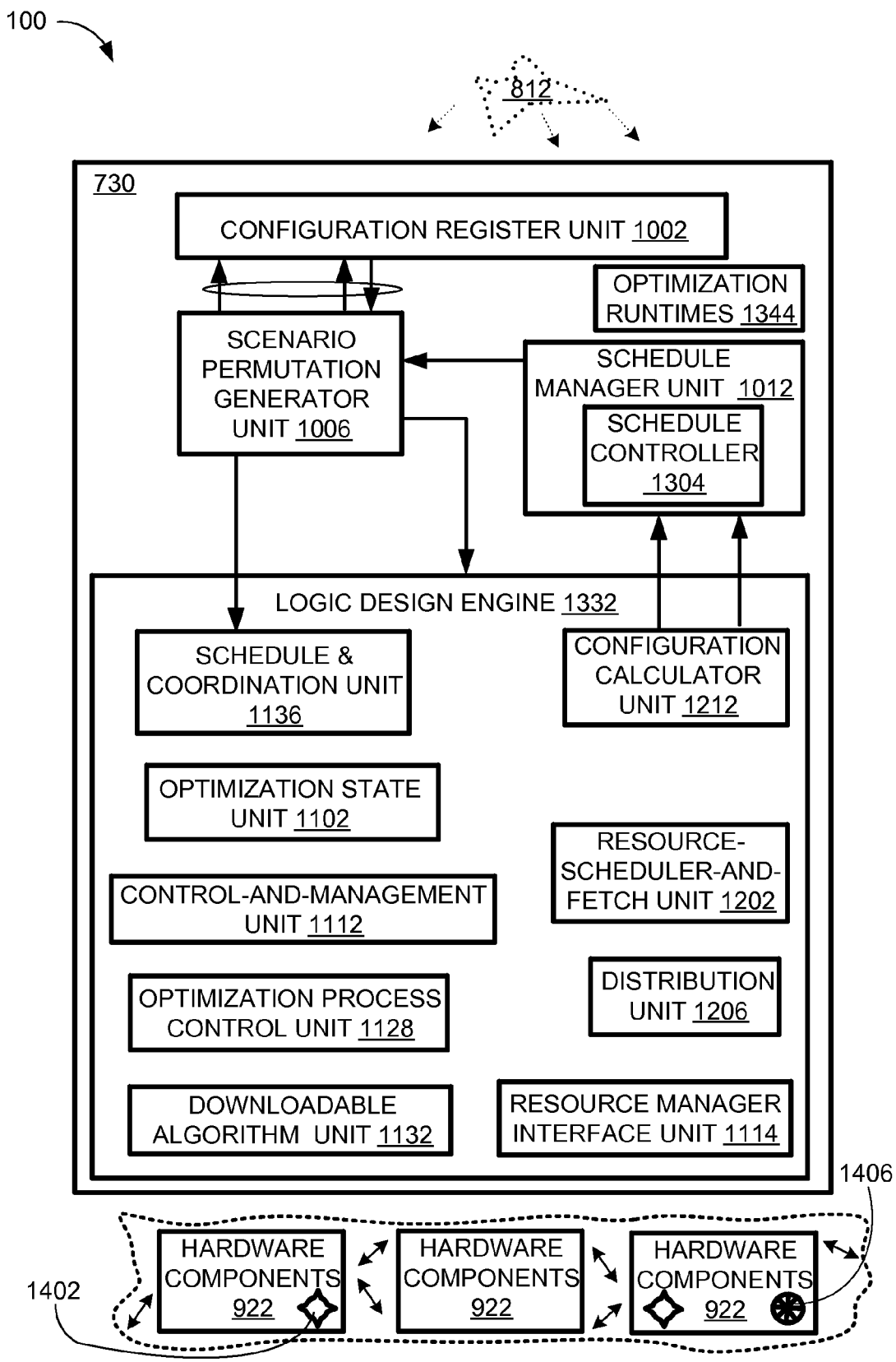
FIG. 14 is the diagram of FIG. 13 with reserved hardware areas.

Referring now to FIG. 14, therein is shown the diagram of FIG. 13 with reserved hardware areas. Shown is the schedule engine 730 and spare hardware areas 1402 in some of the hardware components 922. The spare hardware areas 1402 can be reserved areas within the hardware components 922 having a number of inputs or outputs allocated or areas having a portion of the hardware components 922 allocated, reserved, and without inputs or outputs.

The schedule controller 1304 can allocate the spare hardware areas 1402 in addition to the portions of the hardware components 922 in any of the scheduled-time-slices 918 of FIG. 9 selected to address the first trigger event. The spare hardware areas 1402 are transparent in any of the scheduled-time-slices 918 and can be redirected, applied, or activated by the schedule controller 1304 as needed based on changes due to new priorities or events such as the trigger events 812.

An unanticipated event, such as a logic fault error 1406 for example, can occur which could immobilize activities of the hardware components 922 in any of the scheduled-time-slices 918. The schedule manager unit 1012 can remediate or address the unanticipated event by initiating activities to create corrective descriptors of the hardware descriptors 804 of FIG. 8 to resolve the problem by using all or portions of the spare hardware areas 1402.

The schedule manager unit 1012 can also update the hardware descriptors 804 by decimating the reconfigurable hardware devices 202 associated with the logic fault error 1406 including or inserting the corrective descriptors of the hardware descriptors 804.

Source of the logic fault error 1406 can be grouped, isolated, and replaced using the hardware components 922 associated with the hardware descriptors 803 that have been created. Alternatively, the hardware components 922 having the logic fault error 1406 can be completely replaced with the hardware components 922 and the spare hardware areas 1402 associated with the hardware descriptors 803 that are have been created.

In another example, another of the logic fault error 1406 can occur in one of the hardware components 922 not having any of the spare hardware areas 1402 and requiring remediation. The schedule manager unit 1012 analyzes the priorities of all of the scheduled-time-slices 918 and chooses to decimate one of the hardware components 922 allocated with the spare hardware areas 1402. The one of the hardware components 922 decimated can be reallocated and used to generate another of the hardware descriptors 804 used to resolve the hardware components 922 having the another of the logic fault error 1406. The decimated one of the hardware components 922 can be rescheduled by changing the scheduled-time-slices 918 assigned to the hardware descriptors 804 of the decimated one of the hardware components 922 for resumption or re-execution.

It has been discovered that the schedule engine 730 allocating or reserving the hardware components 922 with the spare hardware areas 1402 provides localized remediation capabilities to maximize resource availability and minimize impact to the operations of the hardware components 922 not being remediated.

In yet another example, the schedule engine 730 detects multiple high priority events of the trigger events 812, has a surplus of the spare hardware areas 1402 available in the dynamic resource pool 1302, and does not have any of the optimization time slots 914 FIG. 9 available to service the multiple high priority events of the trigger events 812. The schedule engine 730 establishes peer-to-peer networked connections to another of the schedule engine 730 of another of the microkernel 604 of FIG. 6 in the computing system 100.

The another of the schedule engine 730 has a surplus of the optimization time slots 914. The another of the schedule engine 730 can initialize and activate several of the optimization time slots 914 of the another of the schedule engine 730 to deactivate and free the spare hardware areas 1402. The another of the schedule engine 730 can generate several of the hardware descriptors 804 using the hardware components 922 recovered from the spare hardware areas 1402. The schedule engine 730 can activate in the scheduled-time-slices 918 the several of the hardware descriptors 804 to respond to the multiple high priority events of the trigger events 812 received by the schedule engine 730.

The configuration register unit 1002, the scenario permutation generator unit 1006, the optimization runtimes 1344, and the logic design engine 1332 of the schedule engine 730 are shown. Also, the schedule and coordination unit 1136, the optimization state unit 1102, the control-and-management unit 1112, the optimization process control unit 1128, the downloadable algorithm unit 1132, the configuration calculator unit 1212, the resource-scheduler-and-fetch unit 1202, the distribution unit 1206, and the resource manager interface unit 1114 are shown.

It has been discovered that the networking of the computing system, the hardware threads 808, and the peer-to-peer communication provisions of the microkernel 604 enables peer-to-peer sharing of all of hardware resources in the computing system 100.

It has been discovered that the networking of the computing system, the hardware threads 808, and the peer-to-peer communication provisions of the microkernel 604 provides each of the microkernel 604 with fully scalable and configurable access to the computing system 100.

Figure 15:
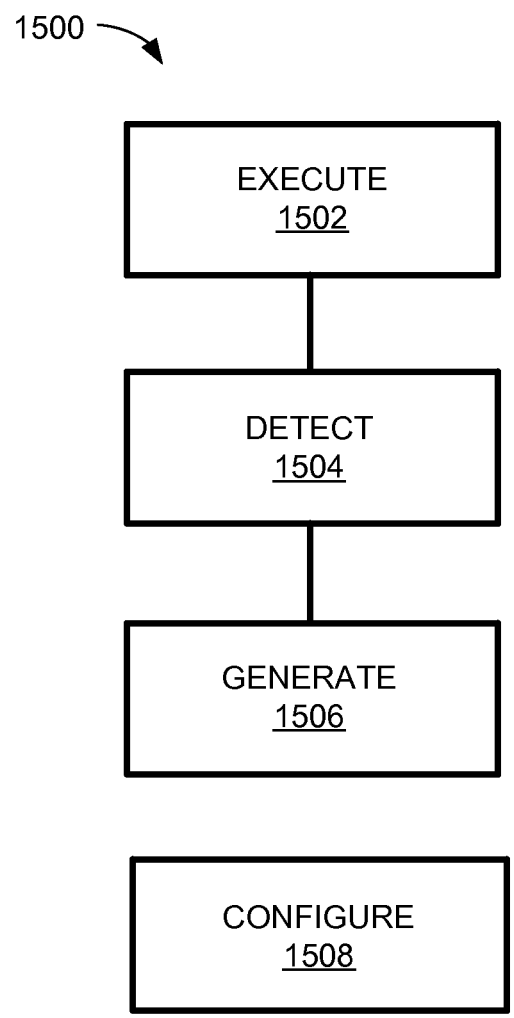
FIG. 15 is a flow chart of a method of operation of the computing system in a further embodiment of the present invention.

Referring now to FIG. 15, therein is shown is a flow chart of a method 1500 of operation of the computing system 100 in a further embodiment of the present invention. The method 1500 includes: executing a first application, active and implemented as hardware within a hardware component having of one or more of reconfigurable hardware devices in a block 1502; detecting a trigger event in a first microkernel in a block 1504; generating a first hardware descriptor based on the trigger event, the first hardware descriptor to configure a portion of the hardware component for the first application or a second application in a block 1506; and configuring the portion of the hardware component with the first hardware descriptor while the first application executes concurrently in a block 1508.

Thus, it has been discovered that the computing system furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing the present invention compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a computing system comprising:
   executing a first application, active and implemented as hardware within a hardware component having of one or more of reconfigurable hardware devices;
   detecting a trigger event in a first microkernel;
   generating a first hardware descriptor based on the trigger event, the first hardware descriptor to configure a portion of the hardware component for the first application or a second application; and
   configuring the portion of the hardware component, coupled to the first microkernel, with the first hardware descriptor while the first application executes concurrently, including interfacing with another of the hardware component coupled to a second microkernel.

2. The method as claimed in claim 1 wherein generating the first hardware descriptor includes re-allocating one of a number of the hardware component.

3. The method as claimed in claim 1 further comprising generating a second hardware descriptor for the trigger event concurrent with the generation of the first hardware descriptor.

4. The method as claimed in claim 1 wherein generating the first hardware descriptor includes adjusting an optimization runtime for generating the first hardware descriptor.

5. The method as claimed in claim 1 further comprising updating the first hardware descriptor based on a portion of the reconfigurable hardware devices decimation.

6. A method of operation of a computing system comprising:
   executing a first application, active and implemented as hardware within a hardware component having of one or more of reconfigurable hardware devices;
   detecting a trigger event in a first microkernel;
   generating a first hardware descriptor based on the trigger event, the first hardware descriptor to configure a portion of the hardware component for the first application or a second application;
   generating a second hardware descriptor of the first microkernel; and
   configuring the portion of the hardware component, coupled to the first microkernel, with the first hardware descriptor while the first application executes concurrently, including interfacing with another of the hardware component coupled to a second microkernel.

7. The method as claimed in claim 6 wherein generating the first hardware descriptor includes re-ordering generation of the first hardware descriptor within optimization time slots of the first microkernel based on priorities of a number of the trigger event.

8. The method as claimed in claim 6 wherein generating the second hardware descriptor includes generating the second hardware descriptor based on a logic fault error within the hardware component.

9. The method as claimed in claim 6 wherein generating the first hardware descriptor includes generating the first hardware descriptor using multiple hardware threads within the first microkernel to optimize the generation of the first hardware descriptor.

10. The method as claimed in claim 6 wherein generating the first hardware descriptor includes fragmenting the hardware component into multiple fragments of the hardware component.

11. A computing system comprising:
    a hardware component for executing a first application, active and implemented as hardware within the hardware component having of one or more of reconfigurable hardware devices;
    a trigger handler module for detecting a trigger event in a first microkernel;
    a scenario formulation unit for generating a first hardware descriptor based on the trigger event, the first hardware descriptor to configure a portion of the hardware component for the first application or a second application; and
    a schedule formulation unit for configuring the portion of the hardware component, coupled to the first microkernel, with the first hardware descriptor while the first application executes concurrently, includes another of the hardware component coupled to a second microkernel for interfacing with the hardware component coupled to the first microkernel.

12. The system as claimed in claim 11 wherein the schedule formulation unit is for re-allocating a number of the hardware component.

13. The system as claimed in claim 11 further comprising a second microkernel for generating a second hardware descriptor in the first microkernel for the trigger event in concurrent with the generation of the first hardware descriptor.

14. The system as claimed in claim 11 wherein the scenario formulation unit is for adjusting an optimization runtime of the first microkernel for generating the first hardware descriptor.

15. The system as claimed in claim 11 wherein the scenario formulation unit is for updating the first hardware descriptor based on a portion of the reconfigurable hardware devices decimation.

16. The system as claimed in claim 11 further comprising a scenario formulation unit for generating a second hardware descriptor of the first microkernel.

17. The system as claimed in claim 16 wherein the scenario formulation unit generates the second hardware descriptor of the first microkernel based on a dynamic resource pool having a number of the hardware component for the trigger event.

18. The system as claimed in claim 16 wherein the scenario formulation unit is for re-ordering the generation of the first hardware descriptor within optimization time slots of the first microkernel based on priorities of a number of the trigger event.

19. The system as claimed in claim 16 further comprising a scenario optimizer unit for enabling multiple hardware threads within the first microkernel for use in optimization of the first hardware descriptor.

20. The system as claimed in claim 16 wherein the scenario formulation unit is for generating the first hardware descriptor by fragmenting the hardware component into multiple fragments of the hardware component.

\* \* \* \* \*